(12) United States Patent
Parker

(10) Patent No.: US 6,343,033 B1
(45) Date of Patent: Jan. 29, 2002

(54) VARIABLE PULSE WIDTH MEMORY PROGRAMMING

(75) Inventor: Allan Parker, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/511,874

(22) Filed: Feb. 25, 2000

(51) Int. Cl.⁷ .............................. G11C 7/00; G11C 11/34
(52) U.S. Cl. .......................... 365/185.19; 365/185.18; 365/185.22; 365/185.03; 365/185.14
(58) Field of Search .................... 365/185.01, 185.19, 365/185.18, 185.22, 185.03, 185.14

(56) References Cited

U.S. PATENT DOCUMENTS

| | | | |
|---|---|---|---|
| 5,677,869 A | * 10/1997 | Fazio et al. | 365/185.03 |
| 5,694,356 A | 12/1997 | Wong et al. | 365/185.03 |
| 5,737,265 A | * 4/1998 | Atwood et al. | 365/185.03 |
| 5,751,637 A | * 5/1998 | Chen et al. | 365/185.03 |
| 5,784,316 A | * 7/1998 | Hirata | 365/185.22 |
| 5,812,457 A | 9/1998 | Arase | 365/185.22 |
| 5,872,735 A | 2/1999 | Banks | 365/189.01 |
| 5,873,113 A | 2/1999 | Rezvani | 711/103 |
| 5,892,710 A | * 4/1999 | Fazio et al. | 365/185.03 |
| 5,959,882 A | 9/1999 | Yoshida et al. | 365/185.03 |
| 6,163,485 A | * 12/2000 | Kawahara et al. | 365/185.24 |

FOREIGN PATENT DOCUMENTS

| | | | |
|---|---|---|---|
| EP | 0763828 A2 | 3/1997 | G11C/11/56 |
| EP | 0935254 A2 | 8/1999 | G11C/16/04 |

OTHER PUBLICATIONS

U.S. application No. 09/314,576, filed May 18, 1999, Error Correction Circuit and Method for a Memory Device.
U.S. application No. 09/314,575, filed May 18, 1999, Method of Dual Use of Non–Volatile Memory for Error Correction.
U.S. application No. 09/314,574, filed May 18, 1999, Data Pre–Reading and Error Correction Circuit for a Non–Volatile Memory Device.
Takeuchi K., et al: "A Multiple Cell Architure for High–speed Programming Multilevel Nand Flash Memories," IEEE Journal of Solid State Circuits, US, IEEE, Inc., New York, vol. 33, No. 8, Aug. 1998 (1998–08), pp. 1228–1238, XP000879681, ISSN: 0018–9200, p. 1229, left–hand column, line 4, p. 1230, left–hand column, line 2, figures 3, 4.

* cited by examiner

Primary Examiner—Viet Q. Nguyen
(74) Attorney, Agent, or Firm—Wagner, Murabito & Hao LLP

(57) ABSTRACT

Memory cell programming time can be reduced by using a longer initial pulse followed by regular length pulses as needed. Since memory cell programming pulses have raise and fall times, when the voltage applied is less than the programming voltage, and each programming pulse requires a program verify, which increases the programming overhead, replacing the first few regular pulses with a single longer pulse reduces the programming overhead.

18 Claims, 2 Drawing Sheets

VARIABLE PULSE WIDTH MEMORY PROGRAMMING

RELATED APPLICATIONS

The following application is related by subject matter and is hereby incorporated by reference:

Application Ser. No. 09/513,643 to entitled "Multilevel Cell Programming." Attorney reference 9076/64 filed herewith.

BACKGROUND

A flash memory cell can be a field effect transistor (FET) that includes a select gate, a floating gate, a drain, and a source. A cell can be read by grounding the source, and applying a voltage to a bitline connected with the drain. By applying a voltage to the wordline connected to the select gate, the cell can be switched on and off.

Programming a cell includes trapping excess electrons in the floating gate to increase voltage. This reduces the current conducted by the memory cell when the select voltage is applied to the select gate. The cell is programmed when the cell current is less than a reference current when the select voltage is applied. The cell is erased when the cell current is greater than the reference current and the select voltage is applied.

Memory cells with only two programmable states contain only a single bit of information, such as a "0" or a "1". A multi-level cell ("MLC") is a cell that can be programmed with more than one voltage level. Each voltage level is mapped to corresponding bits of information. For example, a single multilevel cell can be programmed with one of four voltage levels, e.g. −2.5V, 0.0V, +1.0V, +2.0V that correspond to binary bits "00", "01", "10", and "11", respectively. A cell that is programmable at more voltage levels can store more bits of data based on Eqn. 1.

$$N=2^B \qquad \text{Eqn.1}$$

B is the number of bits of data stored

N is the number of voltage levels.

Thus, a 1 bit cell requires 2 voltage levels, a 2 bit cell requires 4 voltage levels, a 3 bit cell requires 8 voltage levels, and a 4 bit cell requires 16 voltage levels.

FIG. 1 shows a representation of a four level multilevel cell program voltage diagram 100. The program voltage distribution ("distribution") of the four levels are shown between lines 102 and 104, 106 and 108, lines 110 and 112, and above line 114, respectively. The programming distribution can be for example 100 mV to 600 mV wide. A four level multilevel memory cell can be programmed with any one of these voltage levels. Because the cell can store one of four binary values it can store 2 bits of information. The data margin ("margin"), also called a guard band, is the voltage levels between distributions that is not normally used. The margins are shown in FIG. 1 between lines 104 and 106; lines 108 and 110; and lines 112 and 114. For example, the data margin can be 800 mV to 100 mV wide.

BRIEF SUMMARY OF THE PREFERRED EMBODIMENTS

Memory cell programming time can be reduced by using a longer initial pulse followed by regular length pulses as needed. Since memory cell programming pulses have raise and fall times, when the voltage applied is less than the programming voltage, and each programming pulse requires a program verify, which increases the programming overhead, replacing the first few regular pulses with a single longer pulse reduces the programming overhead.

BRIEF DESCRIPTION OF SEVERAL VIEWS OF THE DRAWINGS

The present invention is illustrated by way of example and not limitation in the accompanying figures. In the figures, like reference numbers indicate identical or functionally similar elements. Additionally, the left-most digit(s) of a reference number identifies the figure in which the reference number first appears.

DETAILED DESCRIPTION OF THE PREFERRED EMBODIMENTS

Figure 1:
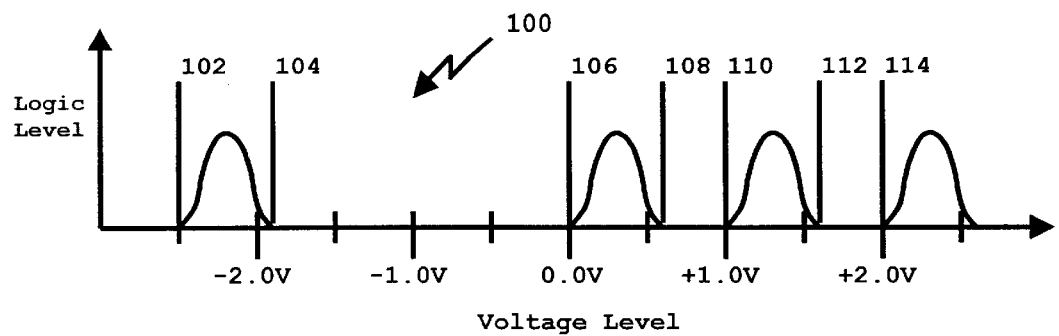
FIG. 1 is a representation of the programmable voltage levels of a multi-level cell.

It is desirable to reduce the time required to program memory cells, for example multi-level NAND memory cells. Traditional programming methods apply a series a identical pulses and each pulse is followed by a verify. The pulses are applied until the verify determines that the cell has been programmed. Each pulse has a rise and fall time during which less than the full programming voltage is applied. In order to reduce the programming time consumed by rise and fall times and verifies, the first programming pulse is increased.

Because the number of traditional programming pulses required to program a cell often vary from cell to cell, a preferred embodiment includes determining the minimum number of traditional pulses and determining the initial pulse to be equal to or less than the minimum number of traditional pulses.

For example, a particular wordline has a minimum programming time of six traditional pulses, each 7.5 $\mu$s wide, and a maximum programming time of ten traditional pulses. Using traditional methods, up to ten 7.5 $\mu$s pulses each followed by a 5 $\mu$s verify would be required to ensure that all cells on the wordline were programmed. The programming time for that wordline would be 125 $\mu$s. See Eqn. 2.

$$\text{Program time}=\#\text{Pulses}\times(\text{width}+\text{verify})$$

$$=10\times(7.5\ \mu\text{s}+5\ \mu\text{s})$$

$$=125\ \mu\text{s} \qquad \text{Eqn. 2}$$

A programming pulse has a raise and fall time, during which time the voltage applied to the cell is less than the programming voltage and thus does not program the cell as well as during the program time of the pulse. For example, a 7.5 $\mu$s pulse has a 3 $\mu$s rise time, a 3.5 $\mu$s programming time, and a 1 $\mu$s fall time. This pulse applies the full programming voltage only during the programming time, which is less than half of the total pulse time.

In a preferred embodiment, the initial pulse of 21.5 $\mu$s is used followed by up to five traditional pulses each followed by a verify. The programming time for that wordline is 84 $\mu$s, which is a 41 $\mu$s (33%) improvement over the traditional method. See Eqn. 3.

$$\text{Program time}=\text{First pulse}+\#\text{Pulses}\times(\text{width}+\text{verify})$$

$$=21.5\ \mu\text{s}+5\times(7.5\ \mu\text{s}+5\ \mu\text{s})$$

$$=84\ \mu\text{s} \qquad \text{Eqn. 3}$$

In this embodiment, the initial pulse width of 21.5 $\mu$s was determined by determining the programming time of the five pulses that were replaced by the initial pulse and adding the raise and fall time of the initial pulse. See Eqn. 4.

Initial pulse=#pulsexprgming time+rise time+fall time

=5×3.5 µs+3 µs+1 µs

=21.5 µs                                                    Eqn. 4

Alternatively, the initial pulse width calculation can include the rise and fall time of the five pulses being replace. Since some voltage is applied to the cell during these time, the width of the initial pulse could be increased to account for this.

In an alternative embodiment, the initial pulse could be any value greater than the traditional pulse width. It is preferred that the initial pulse width be equal to or less than the minimum programming time of the cells on a particular wordline. However, the initial pulse width can be longer than the minimum programming time. For example, if one cell on a wordline has an uncharacteristically short programming time, it is desirable that the initial pulse be closer to the next longer minimum programming time.

The minimum programming time of the cells on a wordline can be determined in a variety of manners. The minimum programming time can be determined by empirical analysis(device analysis), by statistical analysis, by analysis of the design, and by other means.

The minimum programming time for each wordline can be stored for later reference. However, if the same minimum programming time is used for all wordlines in an array of memory, then it is preferred that the minimum programming time is stored only once.

Multi-level memory cells, also called multi-bit memory cells, may have different minimum programming times for the different programming levels. In a one embodiment, the over all minimum programming time is used for all programming levels. In another embodiment, the minimum for each programming level is used for that programming level.

The reduced programming time achieved can be used in several different ways. First, the memory cells can be programmed faster. Second, the pulse count target can be increased, thus narrowing the program distributions, while maintaining the original programming time.

Figure 2:
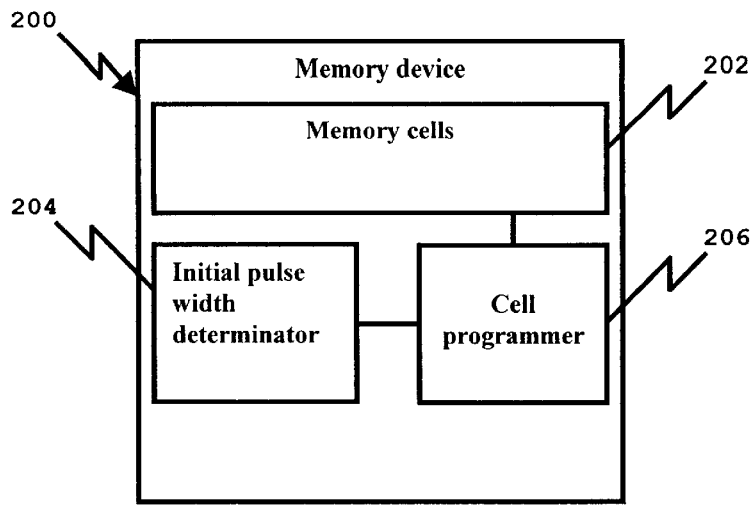
FIG. 2 is a diagram of a memory device.

Referring to FIG. 2, a memory device 200 includes memory cells 202, initial pulse width determinator 204, and a cell programmer 206. The memory cells 202 can include a single memory cell or multiple memory cells such as multiple pages of memory cells where each page includes 1024 memory cells. Preferably, the memory cells 202 are grouped into cells by wordlines. Preferably, the memory cells include NAND flash memory cells. The initial pulse width determinator 204 determines the initial pulse width for the memory cells based on a minimum programming time of a memory cell. For cells connect together via a wordline, the initial pulse width determinator 204. The cell programmer 206 is capable of programming each of the memory cells by applying an initial pulse having the initial pulse width determined by the initial pulse width determinator and applying a series of secondary pulses having a second pulse width. Preferably, the first pulse width is different than the second pulse width. Optionally, the cell programmer 206 can include a verifier that verifies a programming state of a memory cell. The verify indicates when the cell is programmed. The indication is used to stop the series of secondary pulse once the cell is programmed.

Figure 3:
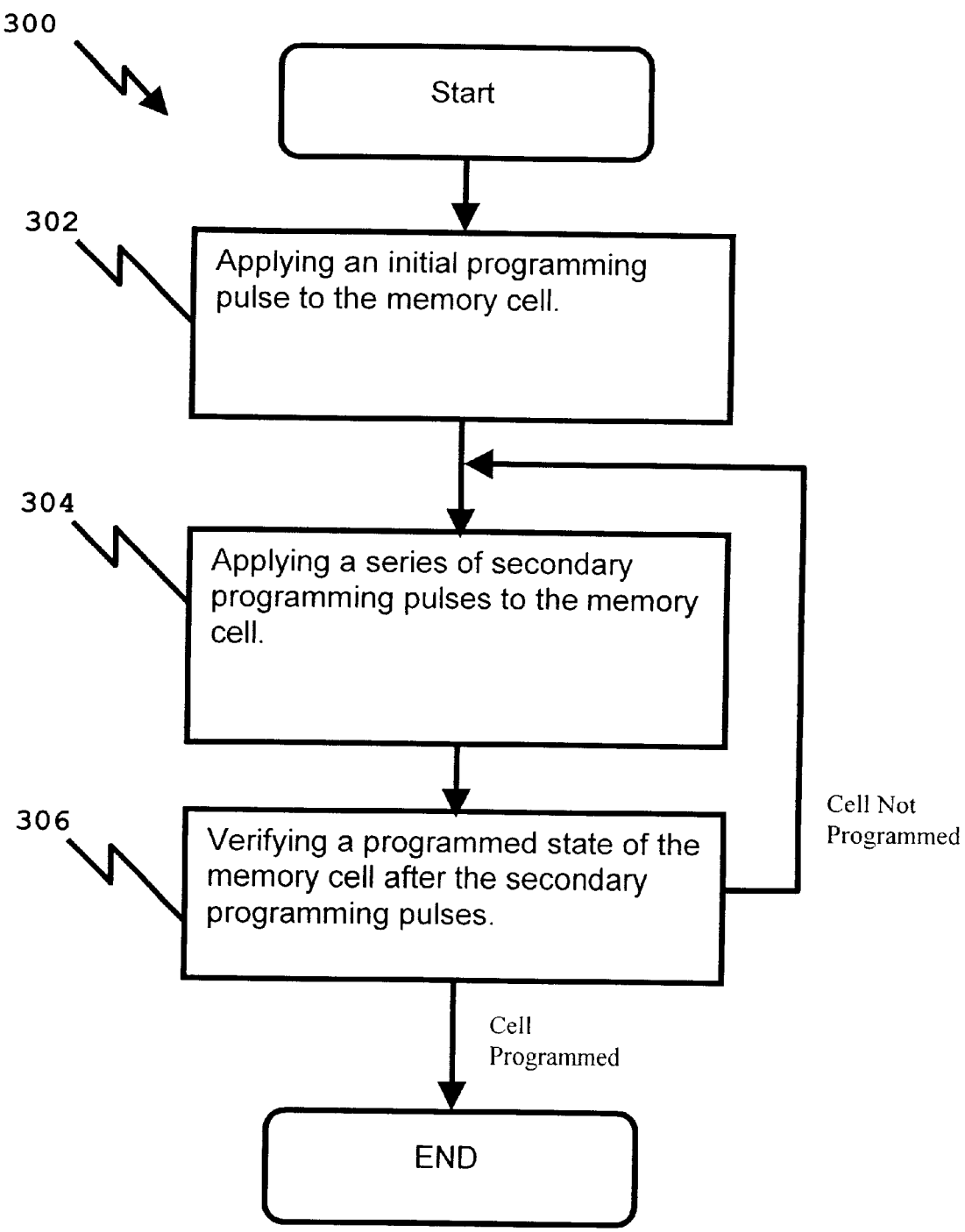
FIG. 3 is a flow diagram of an embodiment of the method of programming memory cells.

Referring to FIG. 3, a method 200 is illustrated that programs a memory cell with an initial pulse width and a series of secondary pulses.

In 302, an initial programming pulse is applied to the memory cell. The pulse width of the initial programming pulse is determined to be close to the minimum programming time of a memory cell. Preferably, the memory cells are grouped together via wordlines and the initial programming pulse width is based on the minimum programming pulse of the memory cells on each wordline.

In 304, a series of secondary programming pulses is applied to the memory cell.

In 306, a programmed state of the memory cell is verified after the secondary programming pulses. Preferably, the programming state of the memory cell is verified after each secondary programming pulse. If the memory cell is not programmed, then another secondary programming pulse is applied. If the memory cell is programmed, the programming is complete. Optionally, the programmed state of the memory cell can also be verified after the initial programming pulse.

While preferred embodiments have been shown and described, it will be understood that they are not intended to limit the disclosure, but rather it is intended to cover all modifications and alternative methods and apparatuses falling within the spirit and scope of the invention as defined in the appended claims or their equivalents.

What is claimed is:

1. A method of programming a memory cell, comprising:
    applying an initial programming pulse to a first memory cell, the initial programming pulse having a first pulse width and a first voltage level;
    applying secondary programming pulses to the first memory cell, the secondary programming pulses having a second pulse width and a second voltage level, wherein the first pulse width is greater than the second pulse width; and
    verifying a programmed state of the first memory cell after the secondary programming pulses;
    wherein said applying an initial programming pulse comprises determining the first pulse width based on a minimum programming time.

2. The method of claim 1, wherein the first pulse width is at least twice as wide as the second pulse width.

3. The method of claim 1, wherein determining the first pulse width includes storing said first pulse width.

4. The method of claim 1, wherein said applying an initial programming pulse comprises determining the first pulse width based on a minimum programming time for a second memory cell on the same wordline as the first memory cell.

5. The method of claim 1, wherein said verifying a programmed state comprises verifying the programming state after each secondary programming pulse.

6. The method of claim 1, wherein said programming a memory cell comprises programming a multi-level NAND memory cell.

7. The method of claim 6, wherein the multi-level memory cell has at least first, second, third and fourth programming levels, the fourth programming level being the erase state, the first programming level being the programming level furthest from the fourth programming level, the second and third programming levels being within the first and fourth programming levels.

8. The method of claim 7, wherein said programming of the multi-level memory cell comprises applying said initial programming pulse and said secondary programming pulses when the multi-level memory cell is programmed in the second and third programming levels, and applying only secondary programming pulses when the multi-level memory cell is programmed in the first level.

9. The method of claim 1, wherein said applying an initial programming pulse further comprises verifying a program state after the initial programming pulse is applied and said applying secondary programming pulses occurs only if said verifying fails to verify the program state.

10. The method of claim 1, wherein said first voltage level is substantially the same as said second voltage level.

11. The method of claim 1, wherein said secondary programming pulses consists of a single secondary programming pulse.

12. A memory device, comprising:
 (a) a plurality of memory cells;
 (b) an initial pulse width determination means for determining an initial pulse width;
 (c) a cell programming means for applying an initial pulse having the initial pulse width determined by the initial pulse width determination means and applying secondary pulses having a second pulse width, the first pulse width being different than the second pulse width; and
 (d) a verify means for verifying a programming state of a memory cell;
 (e) wherein the plurality of memory cells comprises a first group of memory cells that share a wordline, and the initial pulse width determination means determines the initial pulse width for the memory cells on the wordline based on a minimum programming time of a memory cell on the wordline.

13. A memory device, comprising:
 (a) a plurality of memory cells;
 (b) a pulse width determinator capable of determining an initial pulse width; and
 (c) a cell programmer capable of programming the plurality of cells by applying an initial pulse having the initial pulse width determined by the initial pulse width determinator and applying secondary pulses having a second pulse width, the first pulse width being different than the second pulse width;
 (d) wherein the plurality of memory cells comprises a first group of memory cells that share a wordline, and the initial pulse width determinator determines the initial pulse width for the first group of memory cells based on a minimum programming time of a memory cell in the first group of memory cells.

14. The memory device of claim 13 further comprising:
 (d) a verifier capable of verifying a programming state of one or more memory cells of the plurality of memory cells.

15. The memory device of claim 13, wherein the plurality of memory cells includes multi-level cells.

16. The memory device of claim 15, wherein the cell programmer programs a first level with the initial pulse and the secondary pulse; and programs a second level with only the secondary pulse.

17. The memory device of claim 13, wherein the plurality of memory cells comprises at least a first page of memory cells, and said pulse width determinator determines the initial pulse width for the first page of memory cells based on a minimum programming time of a memory cell in the page of memory cells.

18. The memory device of claim 13, wherein said pulse width determinator stores the initial pulse width.

* * * * *